United States Patent
Fujiwara (10) Patent No.: US 7,564,106 B2
(45) Date of Patent: Jul. 21, 2009

(54) SEMICONDUCTOR DEVICE COMPRISING GATE ELECTRODE

(75) Inventor: Hideaki Fujiwara, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 268 days.

(21) Appl. No.: 11/711,726

(22) Filed: Feb. 28, 2007

(65) Prior Publication Data

US 2007/0200186 A1     Aug. 30, 2007

(30) Foreign Application Priority Data

Feb. 28, 2006   (JP)   ............................. 2006-051440

(51) Int. Cl.
*H01L 29/78* (2006.01)
(52) U.S. Cl. .............................. 257/402; 257/E29.255; 438/197
(58) Field of Classification Search ................. 257/407, 257/402, E29.255
See application file for complete search history.

(56) References Cited

U.S. PATENT DOCUMENTS 7,005,697 B2 * 2/2006 Batra et al. ................. 257/315

2006/0118853 A1 * 6/2006 Takata et al. ................. 257/314
2007/0018342 A1 * 1/2007 Sandhu et al. ........ 257/E29.071
2008/0121966 A1 * 5/2008 Muralidhar et al. ......... 257/315

FOREIGN PATENT DOCUMENTS

JP          2004-146740 A       5/2004

* cited by examiner

*Primary Examiner*—W. David Coleman
*Assistant Examiner*—Daniel Shook
(74) *Attorney, Agent, or Firm*—McDermott Will & Emery LLP (57) ABSTRACT

A semiconductor device capable of reducing a threshold voltage is obtained. The semiconductor device includes a pair of source/drain regions formed on the main surface of a semiconductor region to hold a channel region therebetween, and a gate electrode formed on the channel region through a gate insulating film and including a metal-containing layer arranged in the vicinity of an interface between the gate insulating film and the gate electrode, wherein the metal-containing layer is so formed in the form of dots as to partially cover the surface of the gate insulating film, and the average distance between dots forming the metal-containing layer is set to not more than a diameter of the dot of the metal-containing layer.

15 Claims, 8 Drawing Sheets

SEMICONDUCTOR DEVICE COMPRISING GATE ELECTRODE

BACKGROUND OF THE INVENTION

1. Field of the Invention

The present invention relates to a semiconductor device, and more particularly, it relates to a semiconductor device comprising a gate electrode.

2. Description of the Background Art

A MOS transistor is generally known as a semiconductor device comprising a gate electrode. In such a MOS transistor, a gate electrode consisting of a polysilicon layer is formed on a silicon substrate (channel region) through a gate insulating film. A MOS transistor using a high dielectric constant (High-k) insulating film as a gate insulating film is known in general.

In a structure of the conventional MOS transistor, however, in a case where a high dielectric constant insulating film consisting of $HfO_2$ or the like is used as the gate insulating film, for example, silicon included in a gate electrode (polysilicon layer) and a gate insulating film causes an interfacial reaction or the like, thereby disadvantageously causing pinning of the Fermi-level in the gate electrode. Consequently, adjustment of a work function of the gate electrode is difficult, whereby it is disadvantageously difficult to adjust to reduce a threshold voltage of the MOS transistor (semiconductor device).

SUMMARY OF THE INVENTION

The present invention has been proposed in order to solve the aforementioned problem, and an object of the present invention is to provide a semiconductor device capable of reducing a threshold voltage.

A semiconductor device according to an aspect of the present invention comprises a pair of source/drain regions formed on the main surface of a semiconductor region to hold a channel region therebetween and a gate electrode formed on the channel region through a gate insulating film and including a metal-containing layer arranged in the vicinity of an interface between the gate insulating film and the gate electrode. The metal-containing layer is so formed in the form of dots as to partially cover the surface of the gate insulating film, and the average distance between dots forming the metal-containing layer is set to not more than a diameter of the dot forming the metal-containing layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

First Embodiment

A structure of a CMOS as a semiconductor device according to a first embodiment will be now described with reference to FIG. 1.

Figure 1:
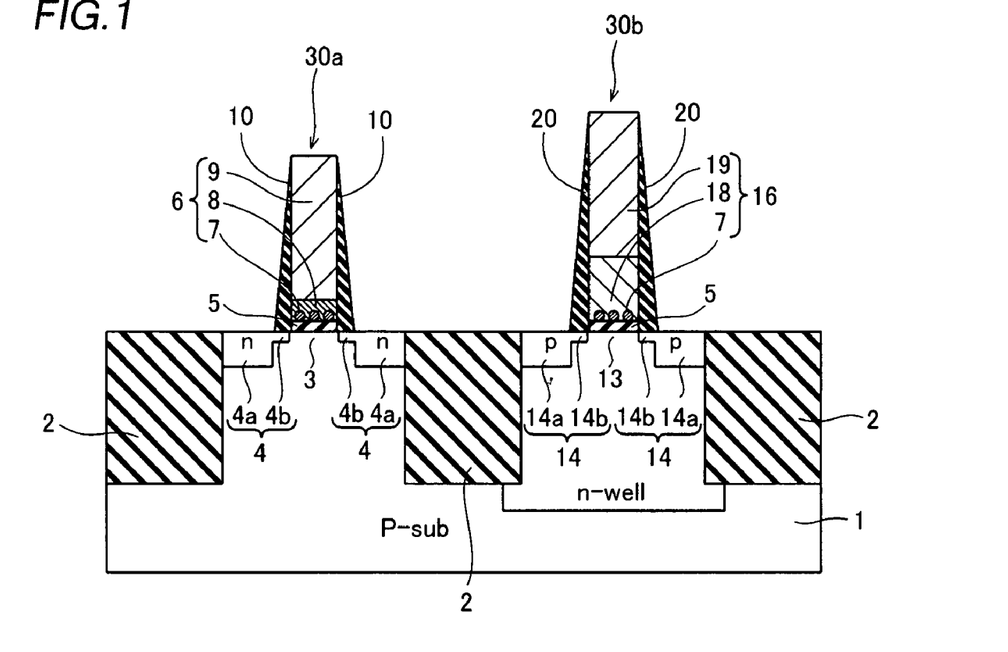
FIG. 1 is a sectional view showing a structure of a CMOS according to a first embodiment of the present invention.

In the CMOS according to the first embodiment, element isolation films 2 of $SiO_2$ are embedded in prescribed regions of a p-type silicon substrate 1 as shown in FIG. 1. The element isolation films 2 embedded in the silicon substrate 1 are provided for isolating an n-channel MOS transistor 30a and a p-channel MOS transistor 30b from each other. The silicon substrate 1 is an example of the "semiconductor region" in the present invention.

As a structure of the n-channel MOS transistor 30a, a pair of n-type source/drain regions 4 are formed on a region formed with the n-channel MOS transistor 30a of the silicon substrate 1 to hold a p-type channel region 3 therebetween. Each source/drain region 4 includes an n-type high-concentration impurity region 4a and an n-type low-concentration impurity region 4b having a lower impurity concentration than the n-type high-concentration impurity region 4a.

In the region formed with the n-channel MOS transistor 30a, a gate electrode 6 is formed on a channel region 3 through a gate insulating film 5. The channel region 3 and the source/drain regions 4, the gate insulating film 5, and the gate electrode 6 constitute the n-channel MOS transistor 30a.

According to the first embodiment, the gate insulating film 5 is constituted by an $HfO_2$ film having a thickness of not more than about 6 nm. The $HfO_2$ film constituting the gate insulating film 5 is a high dielectric constant (High-k) insulating film having a relative dielectric constant higher than 3.9.

According to the first embodiment, the gate electrode 6 includes a metal-containing layer 7 containing TaN located on an interface between the gate electrode 6 and the gate insulating film 5, and $n^+$-type polysilicon layers 8 and 9 sequentially arranged on the metal-containing layer 7. The polysilicon layer 8 is an example of the "semiconductor layer" in the present invention.

The metal-containing layer 7 of the gate electrode 6 in the n-channel MOS transistor 30a is formed in the form of dots to partially cover the surface of the gate insulating film 5. The diameter of one dot of this metal-containing layer 7 is set to about 2 nm to about 3 nm. The average distance between adjacent ones of the dots forming the metal-containing layer 7 is set to not more than the diameter of the dot (about 2 nm to about 3 nm). The metal-containing layer 7 is formed on the surface of the gate insulating film 5 to disperse over the whole areas thereof. While FIG. 1 shows the dots each having the same shape and the same size arranged at the same intervals, the shapes, sizes and intervals of the dots are not the same in practice. In other words, the aforementioned values of the diameter of the dot show the vicinity of a center in distribution allowing statistical variations. The polysilicon layer 8 is formed on the metal-containing layer 7 with a thickness of about 10 nm. The polysilicon layer 8 has a portion embedded in regions located between adjacent ones of the dots forming the metal-containing layer 7, which is so formed as to come into contact with the surface of the gate insulating film 5. The polysilicon layer 9 is formed on the polysilicon layer 8 with a thickness of about 100 nm.

In the region formed with the n-channel MOS transistor 30a, side wall films 10 of $SiO_2$ are formed on the n-type low-concentration impurity regions 4b of the source/drain regions 4, to cover the side surfaces of the gate insulating film 5 and the gate electrode 6.

As a structure of the p-channel MOS transistor 30b, an n-type well region is formed on a region formed with the p-channel transistor 30b of the silicon substrate 1. A pair of p-type source/drain regions 14 are formed on the well region of the silicon substrate 1 to hold an n-type channel region 13 therebetween. Each source/drain region 14 includes a p-type high-concentration impurity region 14a and a p-type low-concentration impurity region 14b having a lower impurity concentration than the p-type high-concentration impurity region 14a.

In the region formed with the p-channel MOS transistor 30b, a gate electrode 16 is formed on the channel region 13 through the gate insulating film 5. The channel region 13 and the source/drain regions 14, the gate insulating film 5, and the gate electrode 16 constitute the p-channel MOS transistor 30b. The gate insulating film 5 of the p-channel MOS transistor 30b is constituted by the same layer as that of the gate insulating film 5 of the n-channel MOS transistor 30a.

According to the first embodiment, the gate electrode 16 includes a metal-containing layer 7 containing TaN located on an interface between the gate electrode 16 and the gate insulating film 5, an Ru silicide layer 18 and a $p^+$-type polysilicon layers 19 sequentially arranged on the metal-containing layer 7. The Ru silicide layer 18 is an example of the "metallic compound layer" in the present invention.

The metal-containing layer 7 of the gate electrode 16 in the p-channel MOS transistor 30b is constituted by the same layer as that of the metal-containing layer 7 of the gate electrode 6 in the n-channel MOS transistor 30a. In other words, the metal-containing layer 7 of the p-channel MOS transistor 30b is formed in the form of dots to partially cover a surface of the gate insulating film 5 similarly to the metal-containing layer 7 of the n-channel MOS transistor 30a, and the average distance between adjacent dots is set to about 1.5 nm so as to be not more than the diameter of the dot (about 2 nm to about 3 nm). The Ru silicide layer 18 is formed on the metal-containing layer 7 with a thickness of about 30 nm. The Ru silicide layer 18 has a portion embedded in regions located between adjacent ones of the dots forming the metal-containing layer 7, which is so formed as to come into contact with the surface of the gate insulating film 5. Ru in this Ru silicide layer 18 has a work function on a side closer to a valence band than an intermediate energy level (mid gap) between a conduction band and the valence band of silicon. A polysilicon layer 19 is formed on the Ru silicide layer 18 with a thickness of about 100 nm.

In the region formed with the p-channel MOS transistor 30b, side wall films 20 of $SiO_2$ are formed on p-type low-concentration impurity regions 14b of the source/drain regions 4, to cover the side surfaces of the gate insulating film 5 and the gate electrode 16.

According to the first embodiment, as hereinabove described, in the p-channel MOS transistor 30b, the metal-containing layer 7 containing TaN formed in the form of dots to partially cover the surface of the gate insulating film 5 are arranged in the vicinity of the interface between the gate electrode 16 and the gate insulating film 5, and the average distance between the dots forming the metal-containing layer 7 is set to about 1.5 nm (not more than the diameter of the dot (about 2 nm to about 3 nm)), whereby the TaN density in the vicinity of the interface between the gate insulating film 5 and the gate electrode 16 is increased, thereby enabling reduction in a contact area of silicon and the gate insulating film 5. Thus, an interfacial reaction between silicon and the gate insulating film 5 or the like can be suppressed, whereby pinning of the Fermi-level in the gate electrode 16 can be suppressed. Consequently, difficulty in adjustment of a work function of the gate electrode 16 can be suppressed, whereby it is possible to adjust to reduce a threshold voltage of the p-channel MOS transistor 30b. Also in the n-channel MOS transistor 30a, the metal-containing layer 7 constituted by the same layer as that of the metal-containing layer 7 of the p-channel MOS transistor 30b is arranged in the vicinity of the interface between the gate electrode 6 and the gate insulating film 5, pining of the Fermi-level in the gate electrode 6 can be suppressed similarly to the aforementioned p-channel MOS transistor 30b.

According to the first embodiment, as hereinabove described, the metal-containing layer 7 arranged in the vicinity of the interface between the gate electrode 6 (16) and the gate insulating film 5 is formed in the form of dots to partially cover the surface of the gate insulating film 5, whereby stress acting between the metal-containing layer 7 and the gate insulating film 5 and the silicon substrate 1 can be reduced as compared with a case where the metal-containing layer 7 is so formed as to cover an overall surface of the gate insulating film 5. Thus, the channel region 3(13) can be inhibited from reduction of the electron mobility resulting from large stress acting between the metal-containing layer 7 and the gate insulating film 5 and the silicon substrate 1.

According to this embodiment, as hereinabove described, the metal-containing layer 7 is arranged in the vicinity of the interface between the gate electrode 6 (16) and the gate insulating film 5 so that the metal density of the gate electrode 6 (16) can be increased in the vicinity of the interface between the gate electrode 6 (16) and the gate insulating film 5 as compared with a case of arranging only a polysilicon layer in the vicinity of the interface between the gate electrode 6 (16) and the gate insulating film 5, whereby the gate electrode 6 (16) can be inhibited from depletion.

According to the first embodiment, as hereinabove described, in the p-channel MOS transistor 30b, while pinning of the Fermi-level in the gate electrode 16 is suppressed by the metal-containing layer 7 in the form of dots arranged on the interface between the gate electrode 16 and the gate insulating film 5, the Ru silicide layer 18 having a work function corresponding to a portion around the valence band of silicon as bulk is so formed as to embedded in the regions located between the dots forming the metal-containing layer 7, whereby the Fermi-level in the gate electrode 16 can be easily adjusted to a level on a side closer to the valence band of silicon. Thus, the work function of the gate electrode 16 can be adjusted to a larger level, whereby the threshold voltage of the p-channel MOS transistor 30b can be adjusted to a smaller level. Pinning of the Fermi-level in the gate electrode 16 is suppressed by the metal-containing layer 7 in the form of dots arranged on the interface between the gate electrode 16 and the gate insulating film 5, whereby the work function can be effectively adjusted by reduced materials (materials constituting the Ru silicide layer 18).

A process of fabricating the CMOS according to the first embodiment will be now described with reference to FIGS. 1 to 10.

Figure 2:
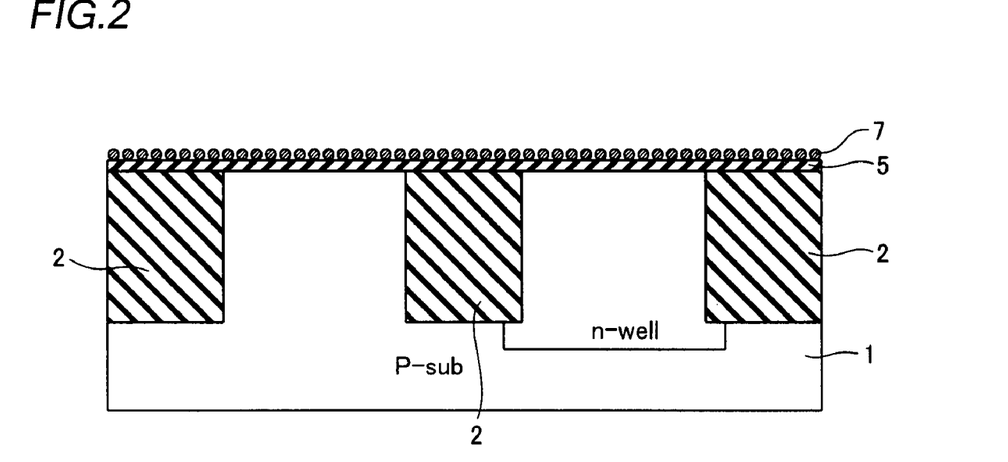
FIGS. 2 to 10 are sectional views for illustrating a process of fabricating the CMOS according to the first embodiment of the present invention.

As shown in FIG. 2, the n-type well region is formed on the region formed with the p-channel MOS transistor 30b (see FIG. 1) of the p-type silicon substrate 1. Thereafter, the regions to be embedded with the element isolation films 2 of the silicon substrate 1 are removed by photolithography and etching, as shown in FIG. 2. Then, the element isolation films 2 of $SiO_2$ are embedded in the aforementioned removed regions of the silicon substrate 1 by CVD (chemical vapor deposition).

The gate insulating film 5 of $HfO_2$ film having a thickness of not more than about 6 nm is formed on the overall surface by CVD. Thereafter the metal-containing layer 7 containing TaN is so formed in the form of dots by CVD as to partially cover the surface of the gate insulating film 5. At this time, the period of time for supplying material gas is set such that the diameter of one dot of the metal-containing layer 7 is about 2 nm to about 3 nm and the average distance between adjacent dots is about 1.5 nm (not more than the diameter of the dot).

Figure 3:
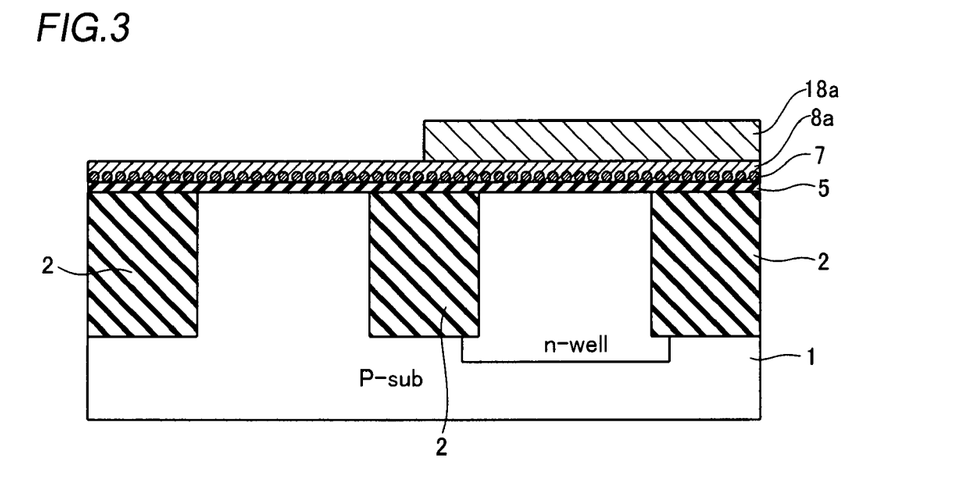

As shown in FIG. 3, an amorphous silicon layer 8*a* having a thickness of about 10 nm is formed on the metal-containing layer 7 by CVD. The amorphous silicon layer 8*a* has the portion embedded in the regions located between adjacent ones of the dots forming the metal-containing layer 7, which is so formed as to come into contact with the surface of the gate insulating film 5. Thereafter an Ru layer 18*a* having a thickness of about 20 nm is formed on the region formed with the p-channel MOS transistor 30*b* (see FIG. 1) on the amorphous silicon layer 8*a* by sputtering.

Figure 4:
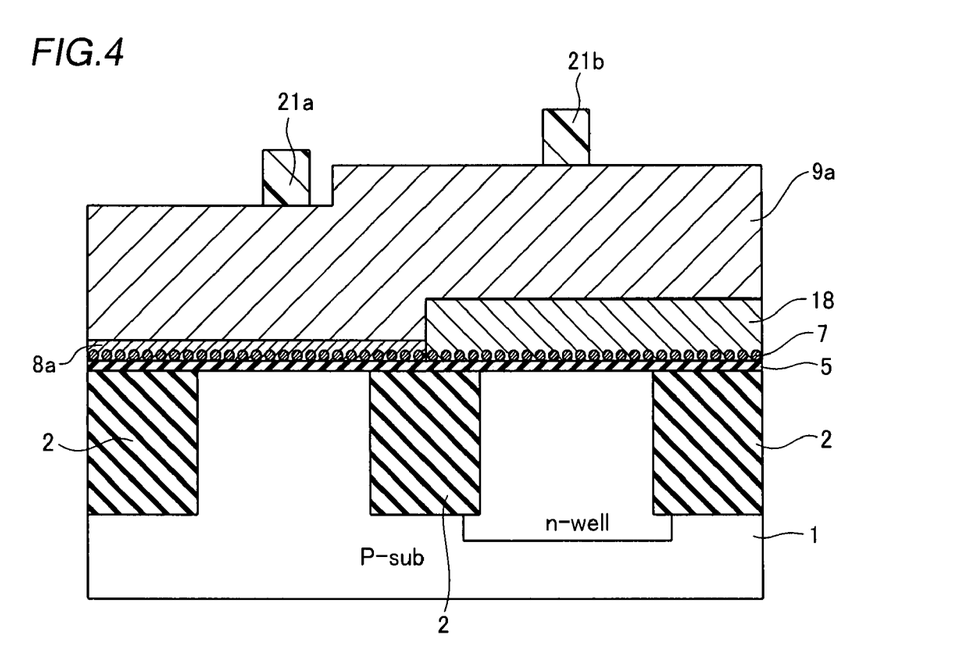

As shown in FIG. 4, the amorphous silicon layer 9*a* having a thickness of about 100 nm is so formed by CVD as to cover the overall surface. At this time, in the region formed with the p-channel MOS transistor 30*b* (see FIG. 1), the Ru layer 18*a* (see FIG. 3) and a portion located under the Ru layer 18*a* of the amorphous silicon layer 8*a* (see FIG. 3) react with each other through the heat supplied in the aforementioned CVD step. Thus, the Ru silicide layer 18 is formed on the region formed with the p-channel MOS transistor 30*b*. Thereafter a resist film 21*a* is formed on a region corresponding to the gate electrode 6 (see FIG. 1) of the n-channel MOS transistor 30*a* on the amorphous silicon layer 9*a* by photolithography, and the resist film 21*b* is formed on the region corresponding to the gate electrode 16 (see FIG. 1) of the p-channel MOS transistor 30*b* on the amorphous silicon layer 9*a*.

Figure 5:
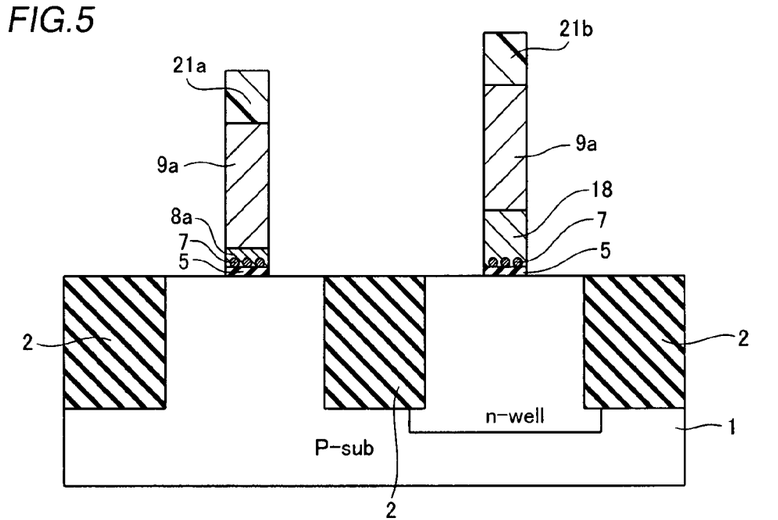

As shown in FIG. 5, in the region formed with the n-channel MOS transistor 30*a* (see FIG. 1), the resist film 21*a* is employed as a mask for etching the amorphous silicon layers 9*a* and 8*a*, the metal-containing layer 7, and the gate insulating film 5 by RIE (reactive ion etching). In the region formed with the p-channel MOS transistor 30*b* (see FIG. 1), the resist film 21*b* is employed as a mask for etching the amorphous silicon layer 9*a*, the Ru silicide layer 18, the metal-containing layer 7, and the gate insulating film 5. Thereafter the resist films 21*a* and 21*b* are removed.

Figure 6:
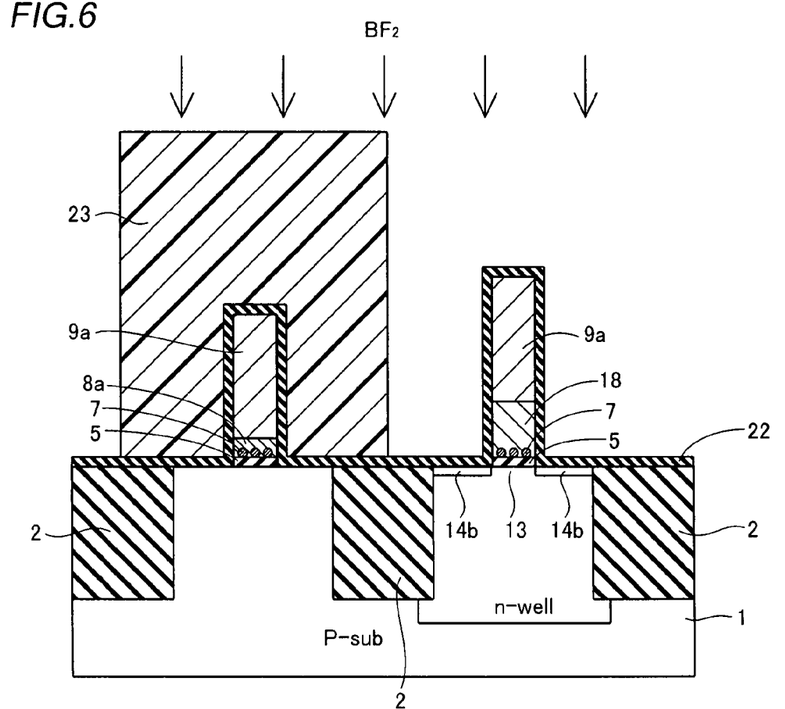

As shown in FIG. 6, a $SiO_2$ film 22 having a thickness of about 10 nm is formed by CVD to cover the overall surface. This $SiO_2$ film 22 has a function of suppressing damage in the vicinity of edges of the gate insulating film 5 in an ion implantation step described later. Thereafter a resist film 23 is formed to cover the region formed with the n-channel MOS transistor 30*a* (see FIG. 1). Thereafter $BF_2$ employed as a p-type impurity is ion-implanted from above the upper surface of the silicon substrate 1 with a low concentration. Thus, the pair of p-type low-concentration impurity regions 14*b* are formed on the region formed with the p-channel MOS transistor 30*b* (see FIG. 1) of the silicon substrate 1 to hold the n-type channel region 13 therebetween. At the same time, a p-type impurity ($BF_2$) is introduced into the amorphous silicon layer 9*a* located on the region formed with the p-channel MOS transistor 30. Thereafter the resist film 23 is removed.

Figure 7:
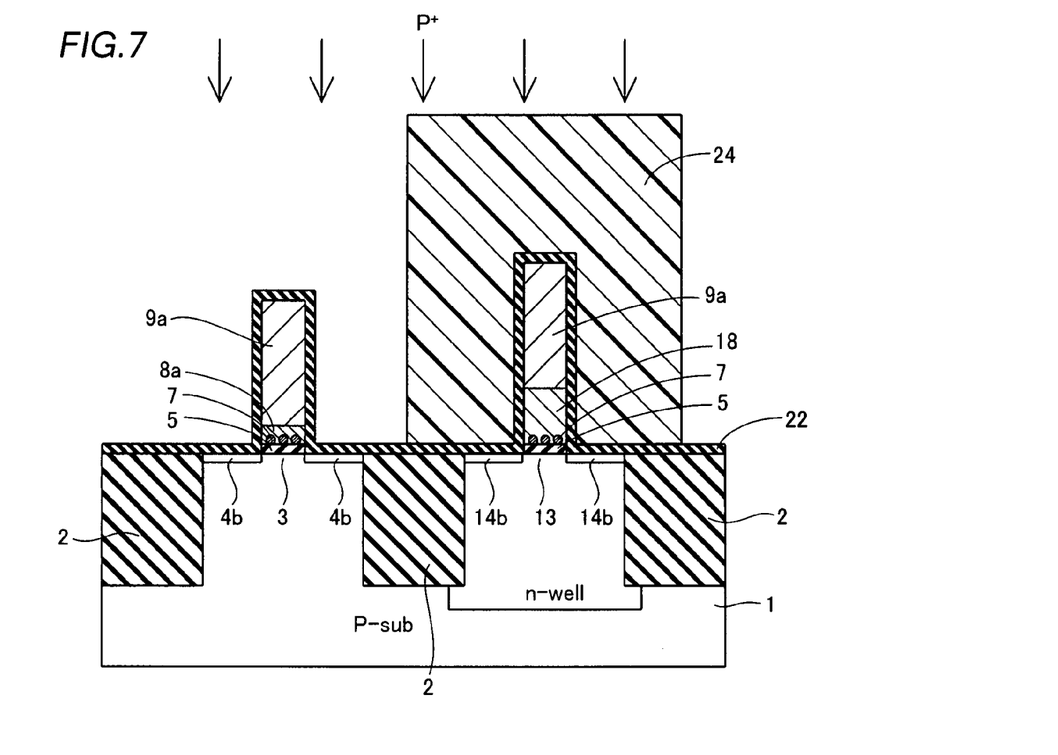

As shown in FIG. 7, a resist film 24 is formed to cover the region formed with the p-channel MOS transistor 30*b* (see FIG. 1). Then, phosphorus (P) employed as an n-type impurity is ion-implanted from above the upper surface of the silicon substrate 1 with a low concentration. Thus, the pair of n-type low-concentration impurity regions 4*b* are formed on the region formed with the n-channel MOS transistor 30*a* (see FIG. 1) of the silicon substrate 1 to hold the p-type channel region 3 therebetween. At the same time, an n-type impurity (P) is introduced into the amorphous silicon layers 9*a* and 8*a* located on the region formed with the n-channel MOS transistor 30*a*. Thereafter the resist film 24 is removed.

Figure 8:
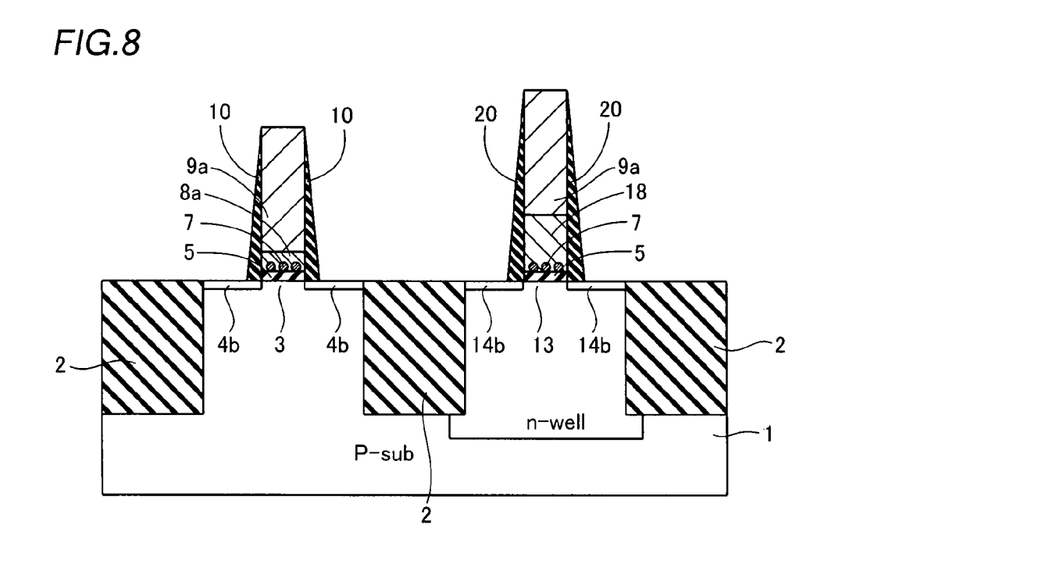

As shown in FIG. 8, another $SiO_2$ film (not shown) is formed by CVD to cover the overall surface and etched back. Thus, in the region formed with the n-channel MOS transistor 30*a* (see FIG. 1), the side wall films 10 of $SiO_2$ are formed to cover the side surfaces of the amorphous silicon layers 9*a* and 8*a*, the metal-containing layer 7 and the gate insulating film 5. In the region formed with the p-channel MOS transistor 30*b* (see FIG. 1), the side wall films 20 of $SiO_2$ are formed to cover the side surfaces of the amorphous silicon layer 9*a*, the Ru silicide layer 18, the metal-containing layer 7 and the gate insulating film 5.

Figure 9:
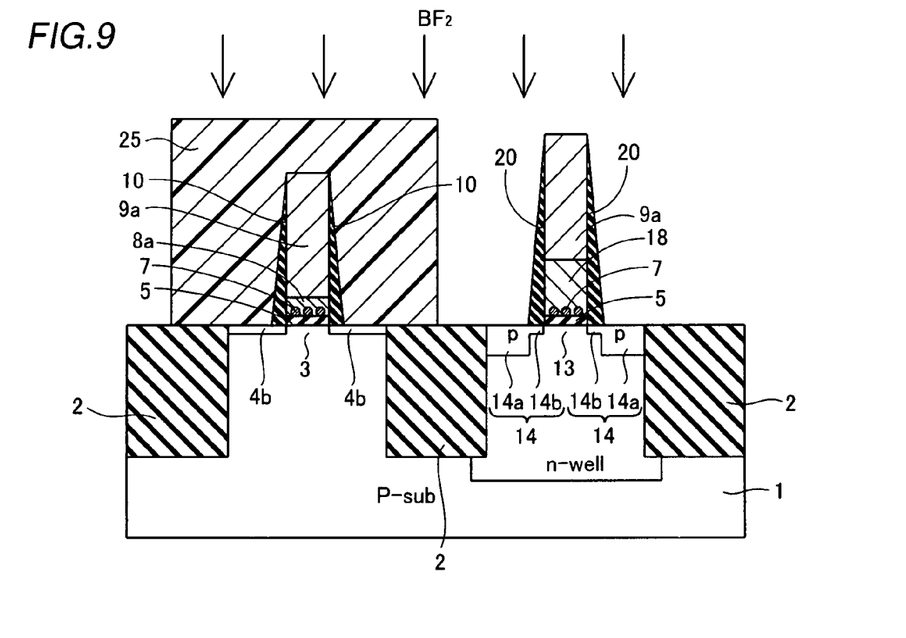

As shown in FIG. 9, a resist film 25 is formed to cover the region formed with the n-channel MOS transistor 30*a* (see FIG. 1). Thereafter $BF_2$ employed as a p-type impurity is ion-implanted from above the upper surface of the silicon substrate 1 with a high concentration. Thus, the pair of source/drain regions 14 including the p-type high-concentration impurity regions 14*a* and the n-type low-concentration impurity regions 14*b* respectively are formed on the region formed with the p-channel MOS transistor 30*b* (see FIG. 1) of silicon substrate 1 to hold the n-type channel region 13 therebetween. At the same time, the p-type impurity ($BF_2$) is introduced into the amorphous silicon layer 9*a* located on the region formed with the p-channel MOS transistor 30*b*. Thereafter the resist film 25 is removed.

Figure 10:
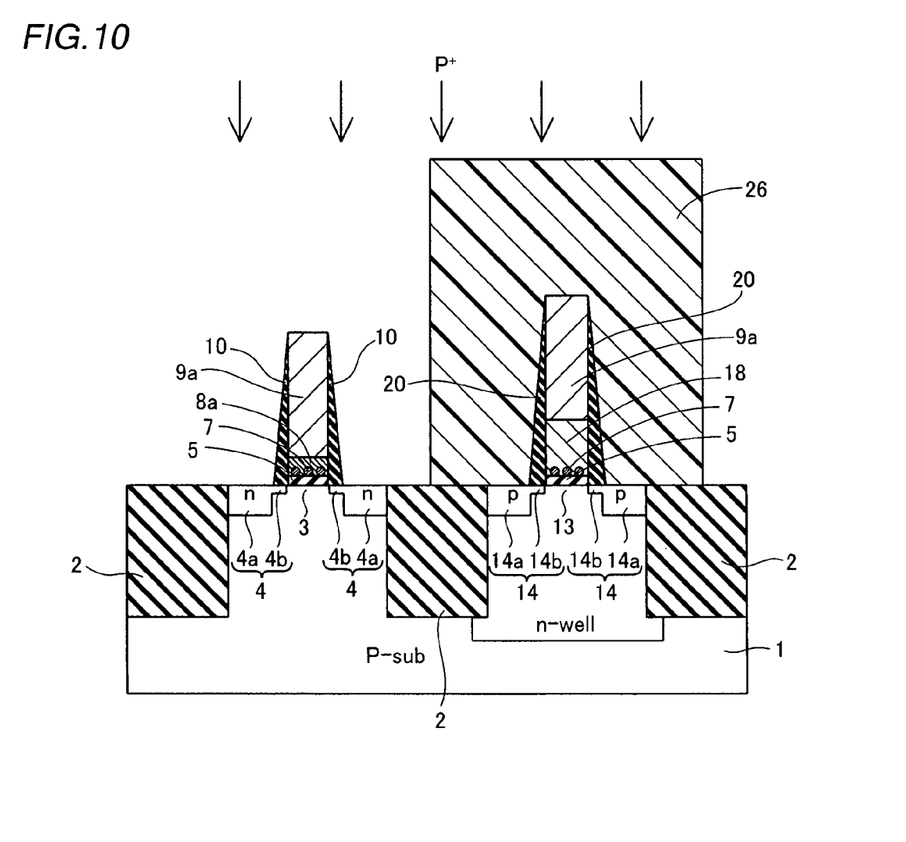

As shown in FIG. 10, a resist film 26 is formed to cover the region formed with the p-channel MOS transistor 30*b* (see FIG. 1). Then, phosphorus (P) employed as the n-type impurity is ion-implanted from above the upper surface of the silicon substrate 1 with a high concentration. Thus, the pair of source/drain regions 4 including the n-type high-concentration impurity regions 4*a* and the n-type low-concentration impurity regions 4*b* respectively are formed on the region formed with the n-channel MOS transistor 30*a* (see FIG. 1) of the silicon substrate 1 to hold the p-type channel region 3 therebetween. At the same time, the n-type impurity (P) is introduced into the amorphous silicon layers 9*a* and 8*a* located on the region formed with the n-channel MOS transistor 30*a*. Thereafter, the resist film 26 is removed.

Then, heat treatment (at about 950° C. for about 20 seconds) is performed by RTA (rapid thermal annealing), thereby electrically activating the impurity introduced into the source/drain regions 4 and the amorphous silicon layers 8*a* and 9*a* located on the region formed with the n-channel MOS transistor 30*a* (see FIG. 1), the source/drain regions 14 and the amorphous silicon layer 9*a* located on the region formed with the p-channel MOS transistor 30*b* (see FIG. 1). The amorphous silicon layers 8*a* and 9*a* are crystallized due to this heat treatment. Thus, the gate electrode 6 including the metal-containing layer 7 containing TaN and the $n^+$-type polysilicon layers 8 and 9 is formed in the region formed with the n-channel MOS transistor 30*a*, as shown in FIG. 1. The gate electrode 16 including the metal-containing layer 7 containing TaN, the Ru silicide layer 18 and the $p^+$-type polysilicon layer 19 are formed in the region formed with the p-channel MOS transistor 30b. Thus, the n-channel MOS transistor 30a and the p-channel MOS transistor 30b constituting the CMOS according to the first embodiment are formed in this manner.

Second Embodiment

In a second embodiment, a description will be made of a case where a metallic compound layer (Hf silicide layer 42) is embedded in regions located between adjacent ones of dots forming a metal-containing layer in a gate electrode of an n-channel MOS transistor dissimilarly to the aforementioned first embodiment, with reference to FIG. 11.

Figure 11:
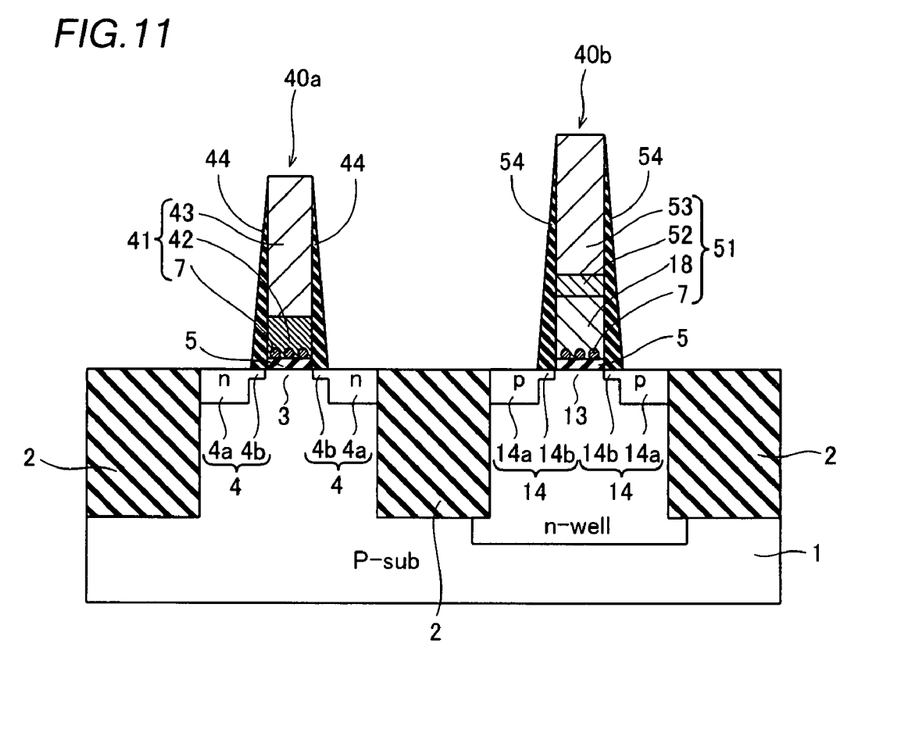
FIG. 11 is a sectional view showing a structure of a CMOS according to a second embodiment of the present invention.

A gate electrode 41 of an n-channel MOS transistor 40a according to the second embodiment includes a metal-containing layer 7 containing TaN located on an interface between the gate electrode 41 and a gate insulating film 5, the Hf silicide layer 42 and an $n^+$-type polysilicon layer 43 sequentially arranged on the metal-containing layer 7, as shown in FIG. 11. The Hf silicide layer 42 is an example of the "metallic compound layer" in the present invention. More specifically, the Hf silicide layer 42 is formed on the metal-containing layer 7 with a thickness of about 20 nm. The Hf silicide layer 42 has a portion embedded in the regions located between adjacent ones of the dots forming the metal-containing layer 7, which is so formed as to come into contact with the surface of the gate insulating film 5. The polysilicon layer 43 is formed on the Hf silicide layer 42 with a thickness of about 100 nm. In the region formed with the n-channel MOS transistor 40a, side wall films 44 of $SiO_2$ are formed on n-type low-concentration impurity regions 4b of source/drain regions 4, to cover the side surfaces of the gate insulating film 5 and the gate electrode 41.

A gate electrode 51 of a p-channel MOS transistor 40b includes the metal-containing layer 7 containing TaN located on an interface between the gate electrode 51 and the gate insulating film 5, and an Ru silicide layer 18, an Hf layer 52 and a $p^+$-type polysilicon layer 53 sequentially arranged on the metal-containing layer 7. The Hf layer 52 is formed on the Ru silicide layer 18 with a thickness of about 10 nm, and the polysilicon layer 53 is formed on the Hf layer 52 with a thickness of about 100 nm. In a region formed with the p-channel MOS transistor 40b, side wall films 54 of $SiO_2$ are formed on the p-type low-concentration impurity regions 14b of the source/drain regions 14 to cover the side surfaces of the gate insulating film 5 and the gate electrode 51.

Remaining structures of the second embodiment are similar to those of the aforementioned first embodiment.

According to the second embodiment, as hereinabove described, in the n-channel MOS transistor 40a, while pinning of the Fermi-level in the gate electrode 41 is suppressed by the metal-containing layer 7 in the form of dots arranged on the interface between the gate electrode 41 and the gate insulating film 5, the Hf silicide layer 42 is formed to be embedded in the regions located between the dots forming the metal-containing layer 7, whereby the Fermi-level in the gate electrode 41 can be easily adjusted to a level on a side closer to a conduction band of silicon by the Hf silicide layer 42 containing Hf having a work function as bulk on the side closer to the conduction band than a mid gap of silicon. Thus, the work function of the gate electrode 41 can be adjusted to a smaller level, whereby the threshold voltage of the n-channel MOS transistor 40a can be adjusted to a smaller level. The pinning of the Fermi-level in the gate electrode 41 is suppressed by the metal-containing layer 7 in the form of dots arranged on the interface between the gate electrode 41 and the gate insulating film 5, the work function can be effectively adjusted by reduced materials (materials constituting the Hf silicide layer 42).

Remaining effects of the second embodiment are similar to those of the aforementioned first embodiment.

A process of fabricating the CMOS according to the second embodiment will be now described with reference to FIGS. 11 to 14.

Figure 12:
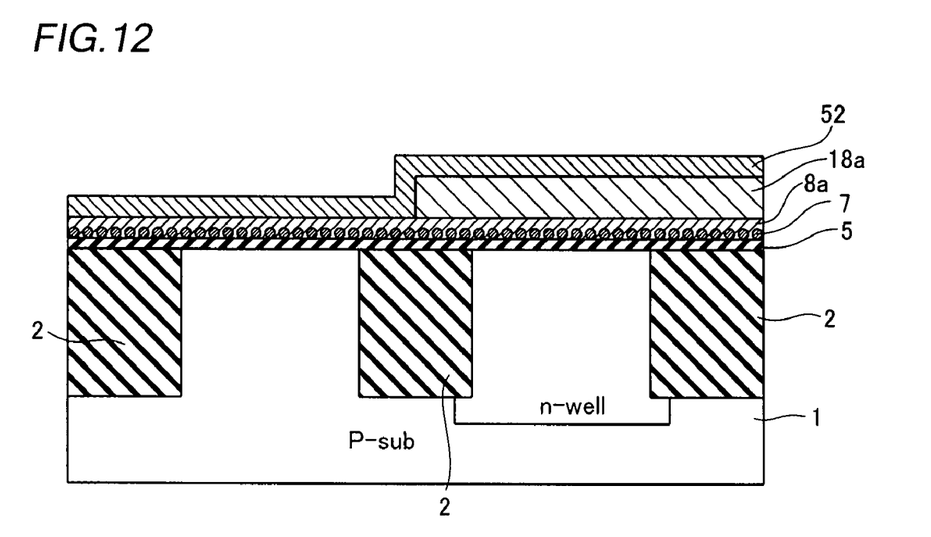
FIGS. 12 to 14 are sectional views for illustrating a process of fabricating the CMOS according to the second embodiment of the present invention.

As shown in FIG. 12, the Ru layer 18a is formed using a fabricating process similar to that in the first embodiment shown in FIGS. 2 and 3. Thereafter the Hf layer 52 having a thickness of about 10 nm is formed on the overall surface by sputtering.

Figure 13:
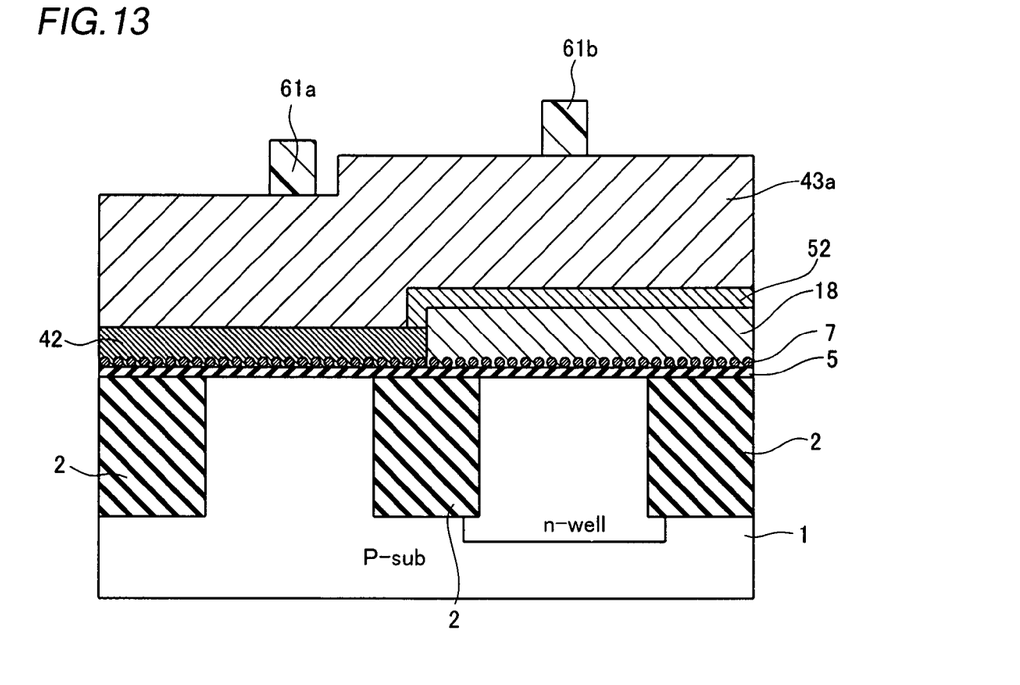

As shown in FIG. 13, an amorphous silicon layer 43a having a thickness of about 100 nm is formed by CVD to cover the overall surface. At this time, in the region formed with the p-channel MOS transistor 40b (see FIG. 11), the Ru layer 18a (see FIG. 12) and a portion located under the Ru layer 18a of the amorphous silicon layer 8a (see FIG. 12) react with each other through the heat supplied in the aforementioned CVD step. Thus, the Ru silicide layer 18 is formed on the region formed with the p-channel MOS transistor 40b. In the region formed with the n-channel MOS transistor 40a (see FIG. 11), the Hf layer 52 (see FIG. 12) and a portion located under the Hf layer 52 of the amorphous silicon layer 8a (see FIG. 12) react with each other through the heat supplied in the aforementioned CVD step. Thus, the Hf silicide layer 42 is formed on the region formed with the n-channel MOS transistor 40a. Thereafter a resist film 61a is formed on a region corresponding to the gate electrode 41 (see FIG. 11) of the n-channel MOS transistor 40a on the amorphous silicon layer 43a by photolithography, and a resist film 61b is formed on the region corresponding to the gate electrode 51 (see FIG. 11) of the p-channel MOS transistor 40b on the amorphous silicon layer 43a.

Figure 14:
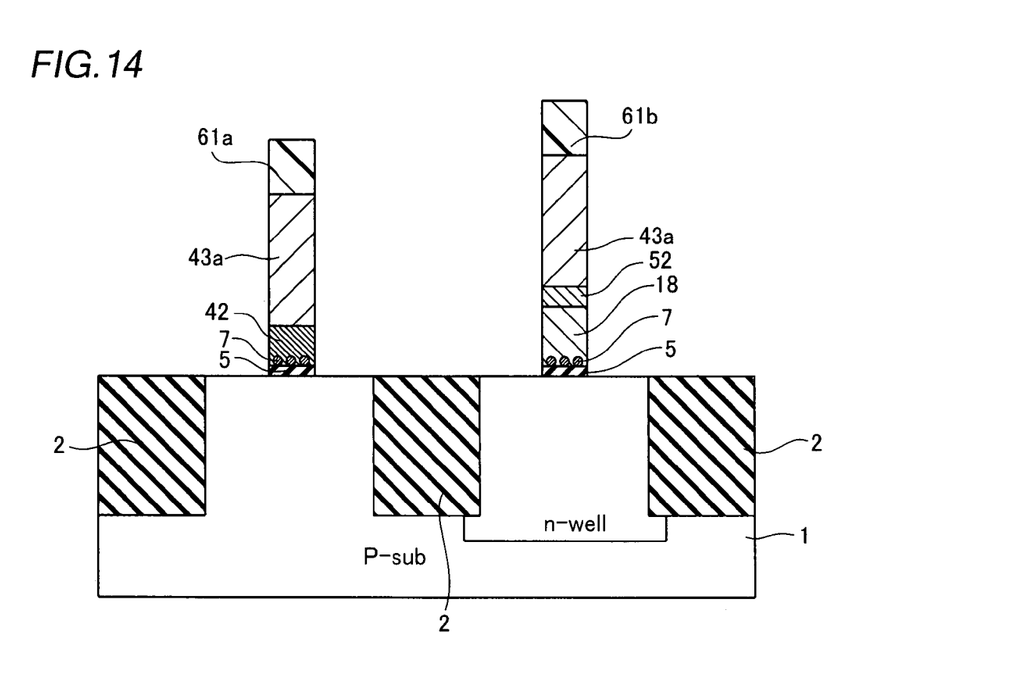

As shown in FIG. 14, the resist film 61a is employed as a mask for etching the amorphous silicon layer 43a, the Hf silicide layer 42, the metal-containing layer 7 and the gate insulating film 5 in the region formed with the n-channel MOS transistor 40a (see FIG. 11) by RIE. The resist film 61b is employed as a mask for etching the amorphous silicon layer 43a, the Hf layer 52, the Ru silicide layer 18, the metal-containing layer 7 and the gate insulating film 5 in the region formed with the p-channel MOS transistor 40b (see FIG. 11). Thereafter the resist films 61a and 61b are removed.

The source/drain regions 4 and 14 (see FIG. 11) are formed using a fabricating process similar to that in the first embodiment shown in FIGS. 6 to 10. Thereafter heat treatment is performed by RTA, thereby electrically activating the impurity introduced into the source/drain regions 4 and 14 and the amorphous silicon layers 43a (see FIG. 14). Thus, the gate electrode 41 including the metal-containing layer 7 containing TaN, the Hf silicide layer 42 and the $n^+$-type polysilicon layer 43 is formed on the region formed with the n-channel MOS transistor 40a as shown in FIG. 11. The gate electrode 51 including the metal-containing layer 7 containing TaN, the Ru silicide layer 18, the Hf layer 52 and the $p^+$-type polysilicon layer 53 are formed on the region formed with the p-channel MOS transistor 40b. Thus, the n-channel MOS transistor 40a and the p-channel MOS transistor 40b constituting the CMOS according to the second embodiment are formed.

An experiment conducted for confirming the aforementioned effects on the pinning of the Fermi-level in the gate electrode will be now described. In this confirmatory experiment, flat band voltages were measured, when the average distance between the dots forming the metal-containing layer containing TaN (work function $\Phi m = 4.6$ eV) was changed in the structure of the MOS transistor according to the aforementioned embodiment.

Figure 15:
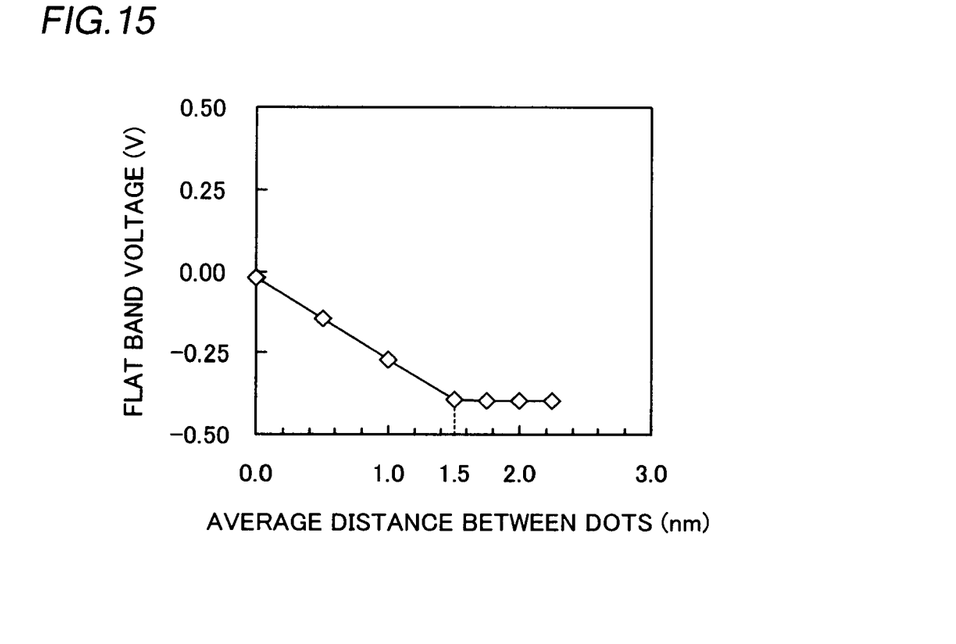
FIG. 15 is a graph showing the relation between average distances between dots forming a metal-containing layer and flat band voltages.

As shown in FIG. 15, it has been proved that the flat band voltage is shifted to a positive (+) side when the average distance between the dots is not more than 1.5 nm. In FIG. 15, the diameter of the dot of the metal-containing layer was 2 nm to 3 nm regardless of the average distance between the dots. In other words, in a case of using the metal-containing layer containing TaN, the diameter of the dots was set to 2 nm to 3 nm, and the average distance between the dots was set to not more than 1.5 nm, whereby the pinning of the Fermi-level in the gate electrode can be conceivably suppressed. As a result, in the first and second embodiments in which the average distance between the dots forming the metal-containing layer containing TaN was set to about 1.5 nm (diameter of the dots (not more than about 2 nm to about 3 nm)), it has been possible to confirm that the pinning of the Fermi-level in the gate electrode can be suppressed.

A description will be made of results of CV measurement (simulation) conducted for investigating variation of CV (gate capacity-gate voltage) characteristic by difference in the average distance between the dots forming the metal-containing layer (metal dot layer) located on the interface between the gate electrode and the gate insulating film.

In this CV measurement (simulation), two kinds of structures in which the metal dot layer (work function Φ m=4.6 eV) was arranged on the interface between the polysilicon layer and the $SiO_2$ film were prepared. In other words, the gate electrodes each having a structure in which the metal dot layer and the polysilicon layer were sequentially deposited on the gate insulating film ($SiO_2$ film) were formed. More specifically, in the metal dot layer included in the first structure, the size of the dot was set to 3 nm (height)×50 nm (width) and the average distance between the dots is set to 50 nm identical with the width of the dot. In the metal dot layer included in the second structure, the size of the dot was set to 3 nm (height)×2 nm (width) and the average distance between the dots was set to 2 nm identical with the width of the dot. In the first and second structures, the metal dot layers are formed to have the same coverage (coverage: 50%) with respect to $SiO_2$ film. In the first and second structures, impurities are introduced into the polysilicon layers with a concentration of $1\times10^{20}$ cm$^{-1}$. In the first and second structures, the thickness of the $SiO_2$ film was set to 1 nm. As a reference example, a structure formed with a metal gate electrode on the gate insulating film ($SiO_2$ film) is also prepared.

A CV characteristic of each structure was measured at a frequency of 1 MHz, while a DC bias voltage (−2.5 V to +1.5 V) is applied to the gate electrode through an Al electrode. In a case where a negative bias voltage was applied, the CV measurement was conducted with respect to each of the aforementioned structures arranged on a p-type silicon substrate (impurity concentration: $1\times10^{17}$ cm$^{-3}$), and in a case where a positive bias voltage was applied, the CV measurement was conducted with respect to each of the aforementioned structures arranged on an n-type silicon substrate (impurity concentration: $1\times10^{17}$ cm$^{-3}$).

Figure 16:
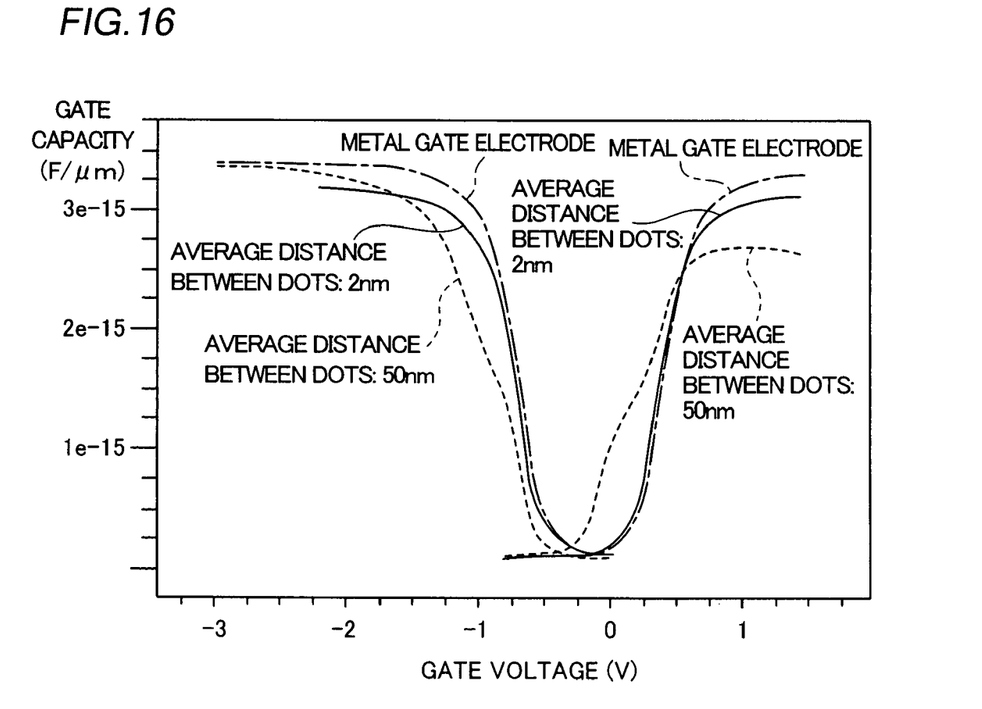
FIG. 16 is a CV characteristic diagram showing results of CV measurement (simulation).

As shown in FIG. 16, it has been proved that in a case where the width of the dot is 2 nm (average distance between the dots: 2 nm), the flat band voltage is shifted to the positive (+) side as compared with a case where the width of the dot is 50 nm (average distance between the dots: 50 nm), and the flat band voltage is substantially identical with the flat band voltage of the metal gate. As a result, even if the metal dot layers have the same coverage (50%) with respect to the $SiO_2$ film, if the average distances between the dots forming the metal dot layers are different, the flat band voltages are conceivably different. Thus, in order to control the flat band voltage of the MOS transistor, it is necessary to consider the size of the dot of the metal-containing layer (metal dot layer) and the average distance between the dots in addition to the coverage of the metal-containing layer (metal dot layer) with respect to the gate insulating film.

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to CMOS as a semiconductor device in the aforementioned first and second embodiments, the present invention is not restricted to this but is also applicable to a semiconductor device including only an n-channel MOS transistor, or a semiconductor device including only a p-channel MOS transistor. Alternatively, the present invention is also applicable to either the n-channel MOS transistor or the p-channel MOS transistor constituting the CMOS.

While the metal-containing layer containing TaN is employed in the aforementioned first and second embodiments, the present invention is not restricted to this but a metal-containing layer including a material other than TaN may be alternatively employed. For example, the metal-containing layers may contain a metal silicide such as TiSi or TaSi, a simple metal or a metal nitride such as TiN. Alternatively, the metal-containing layer may also contain two or more kinds of metals.

While the gate insulating film of the $HfO_2$ film is employed in the aforementioned first and second embodiments, the present invention is not restricted to this but a gate insulating film of a high dielectric constant insulating film other than the $HfO_2$ film may be alternatively employed. For example, a $ZrO_2$ film, an HfAlO film, an SiN film, an SiON film, an HfSiO film or an HfNO film may be employed as the high dielectric constant insulating film other than the $HfO_2$ film.

While the silicon substrate is employed in the aforementioned first and second embodiments, the present invention is not restricted to this but a semiconductor substrate other than the silicon substrate may be alternatively employed. For example, SOI (Silicon on Insulator) substrate formed with a silicon layer on an insulating substrate may be alternatively employed.

While the silicide layer is embedded in the regions located between the dots forming the metal-containing layer in the aforementioned first and second embodiments, the present invention is not restricted to this but a metallic compound layer other than the silicide layer or a metal layer may be alternatively embedded in the regions located between the dots forming the metal-containing layer.

While the film thickness constitution in which the Ru silicide fully serves as metal-rich silicide is shown in the embodiments, the present invention is not restricted to this but the strength of the pinning also depends on an employed High-k material. Therefore, the silicide layer is not limited to the metal-rich silicide. The Hf silicide does not limit a composition ratio of Hf and Si.

What is claimed is:

1. A semiconductor device comprising:
   a pair of source/drain regions formed on the main surface of a semiconductor region to hold a channel region therebetween; and
   a gate electrode formed on said channel region through a gate insulating film and including a metal-containing layer arranged in the vicinity of an interface between said gate insulating film and said gate electrode, wherein
   said metal-containing layer is so formed in the form of dots as to partially cover the surface of said gate insulating film,
   the average distance between dots forming said metal-containing layer is set to not more than a diameter of said dot forming said metal-containing layer, and
   said gate electrode further includes a metal layer or a metallic compound layer so formed as to be embedded in a region between said dots forming said metal-containing layer.

2. The semiconductor device according to claim 1, further comprising a plurality of pairs of source/drain regions including said pair of source/drain regions and a plurality of gate electrodes including said gate electrode, wherein one of said plurality of gate electrodes has a metal layer or a metallic compound layer so formed as to be embedded in a region between said dots forming said metal-containing layer, and another gate electrode has a first semiconductor layer so formed as to be embedded in a region between said dots forming said metal-containing layer.

3. The semiconductor device according to claim 2, wherein said gate electrode includes a second semiconductor layer provided on said first semiconductor layer.

4. The semiconductor device according to claim 3, wherein the thickness of said first semiconductor layer is smaller than that of said second semiconductor layer.

5. The semiconductor device according to claim 2, wherein said first semiconductor layer is constituted by a silicon layer.

6. The semiconductor device according to claim 2, wherein the thickness of said first semiconductor layer is larger than a diameter of said dot of said metal-containing layer.

7. The semiconductor device according to claim 1, wherein said gate electrode includes an upper semiconductor layer provided on said metal layer or said metallic compound layer.

8. The semiconductor device according to claim 7, wherein the thickness of said metal layer or said metallic compound layer is smaller than that of said upper semiconductor layer.

9. The semiconductor device according to claim 1, wherein the average distance between said dots forming said metal-containing layer is not more than 1.5 nm.

10. The semiconductor device according to claim 1, wherein
said source/drain regions are n-type regions, and
said metallic compound layer is constituted by an Hf silicide layer.

11. The semiconductor device according to claim 1, wherein
said source/drain regions are p-type regions, and
said metallic compound layer is constituted by an Ru silicide layer.

12. The semiconductor device according to claim 1, wherein
the thickness of said metal layer or said metallic compound layer is larger than a diameter of said dot of said metal-containing layer.

13. The semiconductor device according to claim 1, wherein
said metal-containing layer is made of TaN.

14. The semiconductor device according to claim 1, wherein
said gate insulating film includes an $HfO_2$ film.

15. The semiconductor device according to claim 1, wherein
said metal-containing layer is so formed on the surfaces of said gate insulating film as to disperse substantially over the whole areas thereof.

* * * * *